United States Patent [19]

Keusseyan

[11] Patent Number: 5,328,521
[45] Date of Patent: Jul. 12, 1994

[54] KINETIC SOLDER PASTE COMPOSITION

[75] Inventor: Roupen L. Keusseyan, Raleigh, N.C.

[73] Assignee: E. I. Du Pont de Nemours and Company, Wilmington, Del.

[21] Appl. No.: 28,482

[22] Filed: Mar. 8, 1993

[51] Int. Cl.$^5$ ............................................. B23K 35/34
[52] U.S. Cl. ........................................ 148/22; 148/24
[58] Field of Search .................................... 148/24, 22

[56] References Cited

U.S. PATENT DOCUMENTS 4,938,924  7/1990  Ozaki ................................. 148/24

Primary Examiner—Peter D. Rosenberg

[57] ABSTRACT

A solder paste composition containing (a) 4–96% by weight finely divided particles of eutectic or pseudo-eutectic metal alloy or mixtures; (b) 96–4% by weight finely divided particles of a metal additive consisting of pure metal, mixtures or alloys thereof having a melting point of at least 30° C. greater than the metal alloy in (a); and (c) an organic medium. The paste is particularly useful for surface mounting metallized components to metallized substrates in microelectronic packaging.

10 Claims, No Drawings

KINETIC SOLDER PASTE COMPOSITION

FIELD OF THE INVENTION

The invention relates to a solder paste composition. More particularly, this invention relates to a solder paste composition for microelectronic packaging.

BACKGROUND OF THE INVENTION

Soldering is a low temperature means for mechanically and electrically joining metal or metallized objects. A molten metal alloy, selected for its low melting point, forms the joint.

In microelectronic packaging, soldering is one of the last steps in assembling the package. Discrete components are constructed with pins, leads or surface metal pads for mounting. The substrate is prepared with complementary receptacles or surface metallization to receive the components. Ultimately, the components are soldered to the substrate. Conventional eutectic and pseudo-eutectic metal alloys and mixtures are used in the solder pastes. These pastes have low melting points, usually on the order of 100°-200° C., allowing the peak soldering temperature to be as low as 120°-220° C.

The low temperatures of soldering render it particularly advantageous for microelectronic package applications. Thermal stress is minimal on the parts being joined, and the integrity of these parts, especially the lower melting circuitry patterns therein, is not compromised by the subsequent low temperature solder operation.

But, soldering joints also have disadvantages. Most notably, the solder joint can be damaged during subsequent high temperature processing or use in a thermally hostile environment, such as under the hood of an automobile. As the temperature approaches the melting point of the solder metal, it softens and flows. Metal in the solder starts to diffuse undesirably into surrounding metallizations. The mechanical and electrical connection can be completely ruptured. And, when the solder is applied to a metallization on a ceramic surface, the solder attacks the metallization-ceramic interface causing the metallization to pull away from the ceramic.

Endeavoring to overcome the disadvantages of conventional solders, modified compositions have been proposed. In *Metallurgica et Materialia*, Vol. 25, pp. 2323-2328, 1991, Betrabet et al. disclose a pseudo-eutectic solder paste additionally containing particles of the intermetallic compound $Ni_3Sn_4$. Similarly, at the National Electronic Packaging and Production Conference (NEPCON) West 92, Anaheim, Calif., 1992, Clough et al. disclosed a eutectic solder paste reinforced with particles of Cu and the intermetallic compound $Cu_6Sn_5$. Mixed results were reported: Betrabet et al. found the $Ni_3Sn_4$ intermetallic promising whereas Clough et al. found no appreciable advantage with the reinforced paste composition. A need still exists for a solder paste composition which reliably performs under hostile temperature conditions over an extended period of time.

SUMMARY OF THE INVENTION

This invention is directed to a solder composition comprising:

(a) 4-96% by weight finely divided particles of eutectic or pseudo-eutectic metal alloy or mixtures;

(b) 96-4% by weight finely divided particles of a metal additive consisting of pure metal, mixtures or alloys thereof having a melting point of 120° C.-1100° C. or at least 30° C. greater than the alloy in (a); and (c) an organic medium.

DETAILED DESCRIPTION OF THE INVENTION

Eutectic and pseudo-eutectic solder paste compositions basically comprise a eutectic or pseudo-eutectic metal alloy or mixture and an organic medium. Flux is optional. Examples of these solder compositions are disclosed in *Solder Paste in Electronics Packaging*, Hwang, p. 73, Van Nostrand Reinhold, New York.

The eutectic metal alloys especially useful in microelectronic packaging are 63 Sn/37 Pb, 42 Sn/58 Bi, 95 Sn/5 Sb, 30 Pb/70 In, 80 Au/20 Sn, and 88 Au/12 Ge. Pseudo-eutectic alloys and mixtures have compositions and properties similar to a eutectic alloy. For example, 60-62 Sn/40-38 Pb and 64-66 Sn/36-34 Pb are pseudo-eutectic alloys and mixtures. Small amounts of metals other than those in the eutectic alloy may also be present in a pseudo-eutectic. Ag, In, Cd and Sb exemplify these other metals. Amounts on the order of less than 5%, commonly 1-3%, are suitable.

The metal additive consists of a pure metal, mixtures of pure metals or alloys of pure metals. The melting point of the metal additive should be at least 30° C. greater than the melting point of the eutectic or pseudo-eutectic metal alloy in the solder paste composition. Generally, the melting point of the metal additive will be in the range of 120° C.-1100° C. Suitable metal additives are any pure metal, mixture thereof or alloy thereof that meets the above melting point criteria and is compatible with the eutectic or pseudo-eutectic metal alloy in the composition. Examples include lead, zinc, antimony, silver and copper, mixtures thereof and alloys thereof as well as alloys with tin, bismuth or indium.

The organic medium is primarily a carrier for the metal particles and provides desirable rheology. Rheology is used here broadly to represent the flow and deformation of solder paste under a given set of conditions (e.g., printing or other application conditions). Any organic medium used in known solder paste compositions may be used in the composition of this invention.

The function of the fluxes in solder paste is to chemically clean the surfaces to be joined, to clean the surfaces of the solder powder and to maintain the cleanliness of both substrate surface and interconnecting lead surface during reflow so that good wetting and metallic continuity between solder alloy and the surfaces joined can be formed. Therefore, broadly speaking, any chemical capable of providing good reactivity with metal oxides and of cleaning the metals commonly used in the soldering area may be used as fluxes. In certain situations, a fluxing/reducing furnace atmosphere is used during the solder reflow cycle to reduce the surface oxides of the solder alloy and surfaces to be joined.

Both the organic medium and flux, when present, are fugitive in nature at the completion of the soldering process, either partially escaping during the heating (reflow) stage through volatilization, decomposition and reaction, or being removed during the subsequent cleaning step. On a permanent basis, the metal joint after reflow is the only functional component in the final solder bond.

The solder paste composition of the invention can be formulated by conventional techniques. For example, particles of the eutectic or pseudo-eutectic metal alloy and particles of the metal additive can be admixed with the liquid organic medium. Alternatively, an admixture of eutectic or pseudo-eutectic metal alloy particles in a liquid organic medium can be combined with a second admixture containing metal additive particles in a liquid organic medium, provided the two organic media are the same or compatible. The resulting solder paste will generally contain 4-96% by weight, based on the total amount of metal in the composition, of the eutectic or pseudo-eutectic and 96-4% by weight, on the same basis, of the metal additive, preferably 10-50% eutectic or pseudo-eutectic and 90-50% metal additive, more preferably 15-30% eutectic or pseudo-eutectic and 85-70% metal additive and most preferably 20-30% eutectic or pseudo-eutectic and 80-70% metal additive.

Conventional techniques for applying solder paste, such as screen- or stencil-printing or syringe application, can be used to apply the paste of this invention. Alternatively, the composition can be applied by ink jet printing or preflowed onto one of the parts being joined. Pins, leads, surface metal pads, metallized windows and any other metallized component can be surface mounted on substrates having complementary metallization. The peak soldering temperatures is about the same as that for compositions containing the eutectic or pseudo-eutectic without the higher melting metal additive. For example, the peak soldering temperature will generally be in the range of 120°-280° C. and any atmosphere, for example, air, nitrogen, hydrogen or mixtures thereof, can be used during the soldering operation. As depicted in the following examples, which are included only to illustrate, not to limit the invention, the joints formed with the solder paste of this invention perform well under hostile temperature conditions, such as thermal cycling, thermal aging and thermal shock.

EXAMPLES

Example 1

In this example, the performance of a conventional eutectic solder and a solder of this invention were compared in a thermal cycling performance test using wire peel adhesion of both solders.

For both solders, the substrates were prepared from 1"×1"×0.025" pieces of 96% alumina. DuPont 5704, a dielectric thick film composition, was printed on the alumina. (All DuPont products referenced herein are available from E. I. du Pont de Nemours & Company, Wilmington, Del.) The dielectric was applied in two layers. The first layer was printed and dried at 150° C. The second layer then was printed and dried directly on top of the first layer. Both layers then were cofired. Each of the two layers of dielectric was 35-40 microns thick dried and approximately 20 microns after firing. Next, DuPont 7484, a conductive thick film composition containing palladium and silver, was printed on each substrate using a pattern of six 0.080" test pads (three wires per substrate, two pads per wire). The fired thickness of the DuPont 7484 was 9-11 microns.

For the conventional eutectic solder, the test parts were prepared using the resulting substrate, 62 Sn/36 Pb/2 Ag solder and the guidelines set forth in the technical bulletin, "Test Method For Wire Peel Adhesion Of Soldered Thick Film Conductors To Ceramic Substrates", DuPont Number H-25649, E. I. du Pont de Nemours & Co., Wilmington, Del. Three clean, 0.032" copper wires were applied to each substrate and the resulting parts were dipped into a solder pot containing the 62 Sn/36 Pb/2 Ag solder.

For the solder of the invention, a composition comprising 30% by weight 63 Sn/37 Pb eutectic alloy particles, 70% by weight 5 Sn/95 Pb metal additive and organic medium was formulated into a paste. A 0.040"×0.040" square of solder paste was screen-printed in the middle of the 0.080"×0.080" pads on the substrates. The resulting parts then were placed into graphite fixtures which would hold the part and wires in alignment during reflow. Next, 0.025" copper wires were placed on top of the solder paste and held in place by the fixture. Two 20 gram copper weights were placed on the wires to hold them down and ensure good contact with the solder. The parts then were run through a vapor phase reflow unit to reflow the solder paste and bond the wires to the metallization of the substrate.

All the assembled parts, those with the conventional solder and those with the solder of the invention, were subjected to the following thermal cycling test. The assembled parts were placed into a thermal cycling chamber. The thermal cycle used was a two hour cycle with peaks of −40 C. and +125 C. The parts spent 20 minutes at each peak and 40 minutes transitioning from peak to peak. After each thermal cycle, the wires were pulled using an Instron tension machine. Both pads were pulled for each of the three wires on the part. The adhesion values measured by the machine for both pads on each wire were compared, and the adhesion value for the weaker of the two pads was defined as the maximum adhesion of the entire wire. Failure for a part was defined as having a peel strength below one fourth of the initial strength.

The number of cycles to failure for the parts soldered with the 62 Sn/36 Pb/2 Ag conventional solder was 50. In contrast, the number of cycles to failure for the parts soldered using the composition of the invention was 200.

Example 2

In this example, the thermal cycling performance for two solders joining components on dielectric thick films was compared by testing the adhesion of 28 lead Short Outline Plastic IC packages (SOIC's). The two solders were: a conventional 63 Sn/37 Pb eutectic paste and a 30% by weight 63 Sn/37 Pb eutectic, 70% by weight 5 Sn/95 Pb alloy paste of the invention.

For both solders, the substrates were prepared from 1"×1"×0.025" pieces of 96% alumina. DuPont QM42, a dielectric thick film composition, was printed on the alumina pieces. The dielectric was applied in two layers. The first layer was printed and dried at 150° C. The second layer then was printed and dried directly on top of the first layer. Both layers then were cofired. Each of the two layers of dielectric was approximately 30 microns thick dried and approximately 20 microns thick fired. Next, DuPont QS170, a conductive thick film composition containing platinum and silver, was printed on the substrates using a pattern of twenty-eight (28) 0.035"×0.050" test pads. The DuPont QS170 had a fired thickness of 8-12 microns.

The test parts for both types of solder were prepared in the same way. The solder paste was printed as 0.030"×0.043" pads in the middle of the QS170 metallization pads on the substrates. The parts then were placed on graphite fixtures to hold them in place during the reflow process. The 28 lead SOIC chips were placed onto the test parts so that the leads of the chip were centered on top of the printed solder paste. The parts then were run through a vapor phase reflow unit to reflow the solder paste and bond the leads to the metallization.

After the parts were soldered, they were checked with an ohm meter to find any open bonds between the lead and metallization, caused by poor soldering. Any open bond would result in an open circuit with infinite resistance. The initial resistance through each entire part was measured in ohms and recorded. The parts without infinite resistance then were placed into a thermal cycling chamber. The cycle used for this example was a two hour cycle with peaks of −40 C. and +125° C. The parts spent 20 minutes at each peak and 40 minutes transitioning from peak to peak. After the parts had completed a desired number of thermal cycles, they were removed from the chamber and the resistance through the circuit was once again checked with an ohm meter and recorded. Parts were defined as "failing" when the resistance in the circuit was greater than 1,000 ohms. After 1250 cycles, no failures had occurred for components soldered with the paste composition of the invention. In contrast, components soldered with the conventional eutectic paste started failing at 100 cycles and all parts had failed after 1250 cycles.

I claim:

1. A solder paste composition comprising:
   (a) 4–96% by weight finely divided particles of eutectic or pseudo-eutectic metal alloy or mixtures;
   (b) 96–4% by weight finely divided particles of a metal additive consisting of pure metal, mixtures or alloys thereof having a melting point of at least 30° C. greater than the metal alloy in (a); and
   (c) an organic medium.

2. The composition of claim 1 comprising:
   (a) 10–50% by weight eutectic or pseudo eutectic metal alloy or mixture;
   (b) 90–50% by weight metal additive.

3. The composition of claim 2 comprising:
   (a) 15–30% by weight eutectic or pseudo-eutectic metal alloy or mixture;
   (b) 85–70% by weight metal additive.

4. The composition of claim 3 comprising:
   (a) 20–30% by weight eutectic or pseudo-eutectic metal alloy or mixture;
   (b) 80–70% by weight metal additive.

5. The composition of claim 1 wherein the eutectic or pseudo-eutectic metal alloy in (a) comprises 63 Sn/37 Pb or 62 Sn/36 Pb/2 Ag.

6. The composition of claim 5 wherein the metal additive in (b) comprises of a tin-lead-silver alloy with a minimum of 40% by weight lead.

7. The composition of claim 6 wherein the metal additive in (b) comprises of an alloy with a minimum of 70% by weight lead.

8. The composition of claim 7 wherein the metal additive in (b) comprises of an alloy with a minimum of 88% by weight lead, examples include 10 Sn/90 Pb, 10 Sn/88 Pb/2 Ag, 5 Sn/95 Pb, 3 Sn/97 Pb, etc.

9. The composition of claim 8 wherein the metal additive in (b) comprises an alloy selected from the group consisting of 10 Sn/90 Pb, 10 Sn/88 Pb/2 Ag, 5 Sn/95 Pb and 3 Sn/97 Pb.

10. The composition of claim 5 wherein the metal additive in (b) comprises a 5 Sn/95 Pb alloy.

* * * * *